(12) United States Patent
Yasuhara et al.

(10) Patent No.: US 6,353,252 B1
(45) Date of Patent: Mar. 5, 2002

(54) HIGH BREAKDOWN VOLTAGE SEMICONDUCTOR DEVICE HAVING TRENCHED FILM CONNECTED TO ELECTRODES

(75) Inventors: Norio Yasuhara, Kawasaki; Kazutoshi Nakamura, Yokohama; Yusuke Kawaguchi, Miura-gun, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/628,715

(22) Filed: Jul. 28, 2000

(30) Foreign Application Priority Data

Jul. 29, 1999 (JP) .......................................... 11-215318

(51) Int. Cl.$^7$ .............................................. H01L 23/58
(52) U.S. Cl. ..................................... 257/487; 257/489
(58) Field of Search ................................ 257/487, 489, 257/491, 492, 493, 330–334

(56) References Cited

U.S. PATENT DOCUMENTS

| | | | |
|---|---|---|---|
| 4,796,070 A | 1/1989 | Black | 357/23.4 |
| 4,947,232 A | 8/1990 | Ashida et al. | 357/53 |
| 5,294,824 A | 3/1994 | Okada | 257/409 |
| 5,378,911 A | * 1/1995 | Murakami | 257/334 |
| 5,438,215 A | 8/1995 | Tihanyi | 257/401 |
| 5,473,180 A | 12/1995 | Ludikhuize | 257/336 |

FOREIGN PATENT DOCUMENTS

| | | |
|---|---|---|
| DE | 198 48 828 | 5/2000 |
| GB | 2 089 118 | 6/1982 |
| JP | 9-266311 | 10/1997 |

OTHER PUBLICATIONS

L. Lorenz, et al. "Cool MOS—An Important Milestone Towards a New Power MOSFET Generation", Power Conversion (PCIM), May 1998 Proceedings, pp. 151–160.

G. Deboy, et al. "A New Generation of High Voltage MOSFETs Breaks the Limit Line of Silicon", Tech. Dig. International Electron Devices Meeting (IEDM), 1998, pp. 683–685 (Month unknown).

Yusuke Kawaguchi, et al. "Predicted Electrical Characteristics of 4500 V Super Multi–Resurf MOSFETs", Proceedings of 1999 International Symposium on Power Semiconductor Devices & ICs, pp. 95–98 (Month Unknown).

Tatsuhiko Fujihira "Theory of Semiconductor Superjunction Devices", Jpn. J. Appl. Phys. vol. 36, 1997, pp. 6254–6262, Part 1, No. 10, Oct. 1997.

Tatsuhiko Fujihira, et al. "Simulated Superior Performances of Semiconductor Superjunction Devices", Proceedings of 1998 International Symposium on Power Semiconductor Devices & ICs, Kyoto, pp. 423–426 (Month Unkown).

* cited by examiner

*Primary Examiner*—David Nelms
*Assistant Examiner*—Tutu Ho
(74) *Attorney, Agent, or Firm*—Oblon, Spivak, McClelland, Maier & Neustadt, P.C.

(57) ABSTRACT

A plurality of trenches are formed in a drift region between a p-type body region and an n-type buffer region. A silicon oxide film is formed on the side and bottom of each of the trenches, and an SIPOS film is buried into each of the trenches. The trenches are formed by RIE, and the SIPOS film is deposited by LPCVD and an undesired portion can be removed by dry etching such as RIE. The SIPOS film is connected to a source electrode at the source end of each trench, and it is connected to a drain electrode directly or through a resistor at the drain end thereof. When a high voltage is applied, a depletion layer expands in the n-type drift region from an interface between the n-type drift region and the trench on each side of the n-type drift region, therefore, the impurity concentration of the n-type drift region can be heightened without lowering the high breakdown voltage, and the resistance of the drift region can be decreased.

10 Claims, 8 Drawing Sheets

HIGH BREAKDOWN VOLTAGE SEMICONDUCTOR DEVICE HAVING TRENCHED FILM CONNECTED TO ELECTRODES

CROSS-REFERENCE TO RELATED APPLICATIONS

This application is based upon and claims the benefit of priority from the prior Japanese Patent Application No. 11-215318, filed Jul. 29, 1999, the entire contents of which are incorporated herein by reference.

BACKGROUND OF THE INVENTION

The present invention relates to a high breakdown voltage semiconductor device and, more specifically, to a technique of reducing the resistance of a drift region of a high breakdown voltage MOSFET.

A high breakdown voltage semiconductor device, such as a high breakdown voltage MOSFET and IGBT, has a drift region whose impurity concentration is relatively low in order to obtain a high breakdown voltage. If a high voltage is applied to the element in an off state, the drift region is depleted and the element withstands the high voltage. Since the drift region is low in impurity concentration, it increases in resistance and has a large share of on-resistance of the element. As the breakdown voltage heightens, the drift region increases in resistance; accordingly, the on-resistance of the element increases.

A high breakdown voltage MOSFET, which has the structure as shown in FIG. 20 to decrease the resistance of a drift region, is proposed in T. Fujihira, "Theory of Semiconductor Superjunction Devices," Jpn. J. Appl. Phys., Vol. 36 (1997), pp 6254–6262. In this MOSFET, a drift region 43 is formed between a p-type body region 41 and an $n^+$-type drain region 42 in order to obtain a high breakdown voltage. The drift region 42 is constituted of p-type layers 44 and n-type layers 45 which are arranged alternately at small pitches in the channel width direction. If a high voltage is applied between the source and drain so as to make the drain positive, a depletion layer expands not only from both a pn junction between the p-type body region 41 and n-type layers 45 and a pn junction between a p-type layer 46 and the n-type layers 45, but also from a pn junction between the p-type layers 44 and n-type layers 45. For this reason, even though the impurity concentration of the n-type layers 45 is set higher than that of the drift region of a normal high breakdown voltage MOSFET, the n-type layers 45 can be depleted and the breakdown voltage can be maintained. With the structure of the MOSFET shown in FIG. 20, therefore, the resistance of the drift region can be lowered by increasing the impurity concentration of the n-type layers 45.

However, in order to achieve the above advantage, the impurity concentration of the n-type layers 45 has to be at least two times as high as that of the normal high breakdown voltage MOSFET, provided that the P– and n-type layers 44 and 45 have the same width a. In order to prevent the breakdown voltage from lowering in this state, the width a need to be reduced and the depth b of the layers 44 and 45 need to be increased to some extent. For example, the depth b should be 2 $\mu$m at the minimum when the width a is 1 $\mu$m. To reduce the on-resistance to half by the same breakdown voltage as that of the normal MOSFET, the depth b should be about 4 $\mu$m at the minimum when the width a is 1 $\mu$m. Such a structure is difficult to achieve by the current manufacturing technique and, if it is done, its manufacture process will be complicated and increased in cost.

As described above, there is a problem in which the conventional superjunction elements are difficult to manufacture in actuality.

BRIEF SUMMARY OF THE INVENTION

The present invention has been developed in consideration of the above situation and its object is to provide a high breakdown voltage semiconductor device which is easy to manufacture and low in on-resistance.

According to a first aspect of the present invention, there is provided a high breakdown voltage semiconductor device formed on a high resistance semiconductor layer, comprising a plurality of trenches formed like a stripe in a drift region in substantially parallel with a current flowing direction, an insulation film formed on a side and a bottom of each of the trenches, and a high resistance film buried into each of the trenches with the insulation film interposed therebetween, wherein the high resistance film is connected to one of source and gate electrodes directly or through a resistor near a source-end portion of each of the trenches, and the high resistance film is connected to a drain electrode directly or through a resistor near a drain-end portion of each of the trenches.

In the high breakdown voltage semiconductor device according to the first aspect of the present invention, the high resistance film may be formed on one of a semi-insulating polycrystalline silicon and polysilicon.

According to a second aspect of the present invention, there is provided a high breakdown voltage semiconductor device formed on a high resistance semiconductor layer of a first conductivity type, comprising a drift region of a second conductivity type selectively formed on a surface of the high resistance semiconductor layer, a plurality of trenches formed like a stripe in the drift region in substantially parallel with a current flowing direction, an insulation film formed on a side and a bottom of each of the trenches, and a high resistance film buried into each of the trenches with the insulation film interposed therebetween, wherein the high resistance film is connected to one of source and gate electrodes directly or through a resistor near a source-end portion of each of the trenches, and the high resistance film is connected to a drain electrode directly or through a resistor near a drain-end portion thereof.

In the high breakdown voltage semiconductor device according to the second aspect of the present invention, the high resistance film may be formed on one of a semi-insulating polycrystalline silicon and polysilicon.

According to a third aspect of the present invention, there is provided a high breakdown voltage semiconductor device including a first high breakdown voltage MOSFET, a second high breakdown voltage MOSFET, a resistor, comprising a plurality of trenches formed like a stripe in a drift region of the first high breakdown voltage MOSFET, in substantially parallel with a current flowing direction, an insulation film formed on a side and a bottom of each of the trenches, and a high resistance film buried into each of the trenches with the insulation film interposed therebetween, wherein the first high breakdown voltage MOSFET and the second high breakdown voltage MOSFET have a common source electrode and a common gate electrode, and one end of the high resistance film is connected to the common gate electrode, while another end thereof is connected to a drain electrode of the second high breakdown voltage MOSFET and one end of the resistor.

In the high breakdown voltage semiconductor device according to the third aspect of the present invention, the high resistance film may be formed on one of a semi-insulating polycrystalline silicon and polysilicon.

In the high breakdown voltage semiconductor device according to the third aspect of the present invention, the first high breakdown voltage MOSFET and the second high breakdown voltage MOSFET may be formed in a common semiconductor layer. The high resistance film may be formed on one of a semi-insulating polycrystalline silicon and polysilicon.

According to a fourth aspect of the present invention, there is provided a high breakdown voltage semiconductor device formed on a high resistance semiconductor layer, comprising, a plurality of trenches formed like a stripe in a drift region in substantially parallel with a current flowing direction, an insulation film formed on a side of each of the trenches, and a high resistance film buried into each of the trenches, wherein the high resistance film is connected to one of source and gate electrodes directly or through a resistor near a source-end portion of each of the trenches, and the high resistance film is connected to a drain region near a drain-end portion of each of the trenches.

In the high breakdown voltage semiconductor device according to the fourth aspect of the present invention, the high resistance film may be formed on one of a semi-insulating polycrystalline silicon and polysilicon.

In the high breakdown voltage semiconductor device according to the present invention, a drift region is divided into a plurality of long regions each interposed between a plurality of trenches, and a depletion layer expands in a drift region from an interface between the drift region and each of the trenches when a reversed bias is applied. Thus, the impurity concentration of the drift region can be normally heightened to cause a high breakdown voltage. Consequently, the on-resistance can be lowered by increasing the impurity concentration of the drift region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
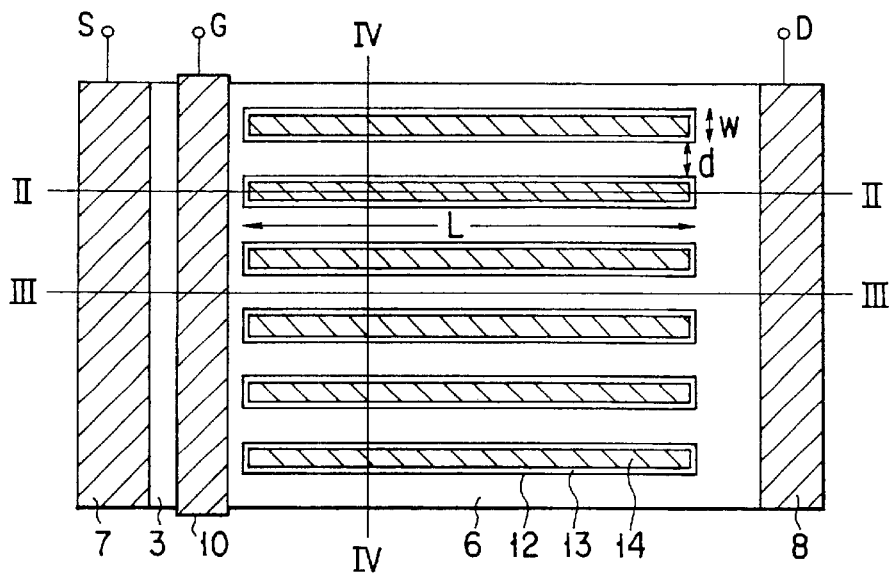
FIG. 1 is a plan view showing a high breakdown voltage MOSFET according to a first embodiment of the present invention.
Figure 2:
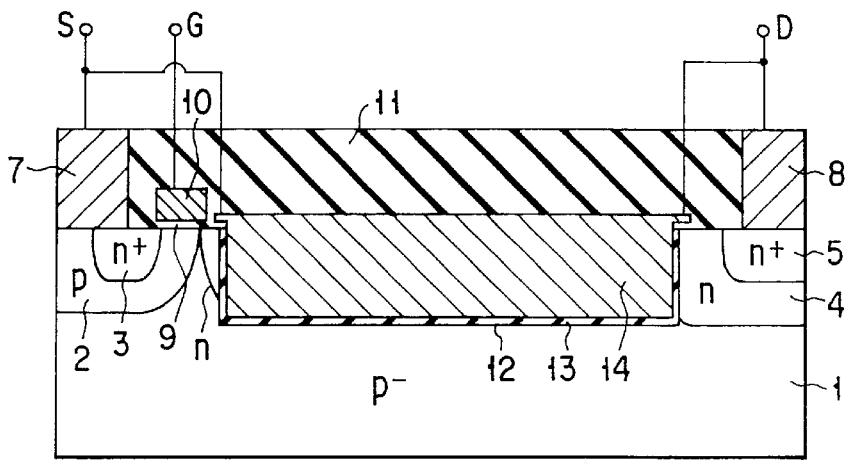
FIG. 2 is a cross-sectional view taken along line II—II of FIG. 1.
Figure 3:
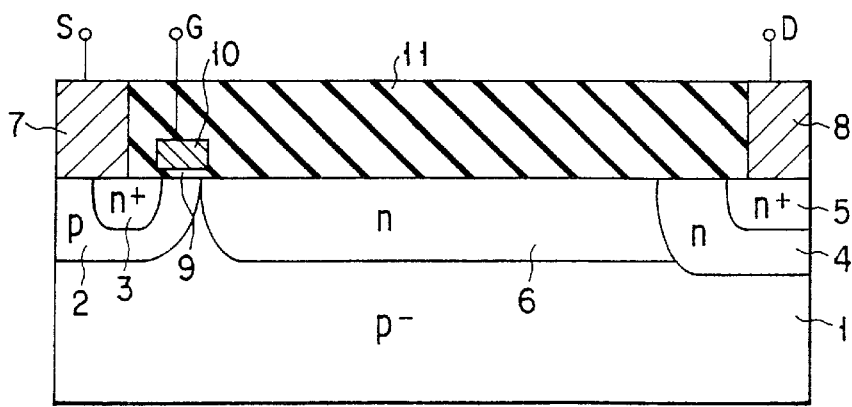
FIG. 3 is a cross-sectional view taken along line III—III of FIG. 1.
Figure 4:
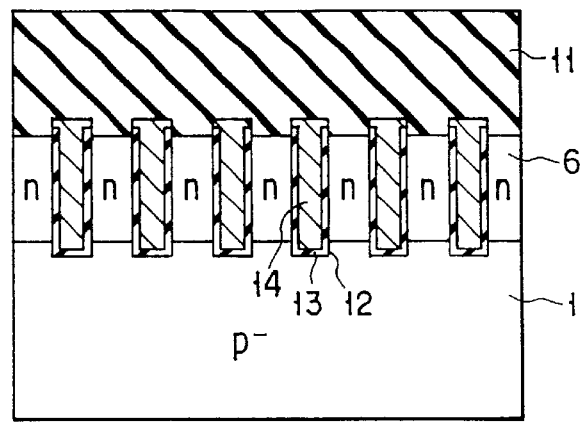
FIG. 4 is a cross-sectional view taken along line IV—IV of FIG. 1.

FIGS. 1 to 4 show the main part of a lateral n-channel high breakdown voltage MOSFET according to a first embodiment of the present invention. FIG. 1 is a plan view thereof, and FIGS. 2 to 4 are cross-sectional views taken along lines II—II, III—III and IV—IV of FIG. 1, respectively. Please note that FIG. 1 does not show an insulation film 11 in order to present the layout of electrodes on an active layer.

A p-type body region 2 is formed selectively on the surface of a high-resistance p⁻-type layer 1 made of monocrystalline silicon, and an n⁺-type source region 3 having a high impurity concentration is formed in the surface area of the body region 2. An n-type buffer region 4 is formed on the surface of the layer 1 at a given distance from the region 2, and an n⁺-type drain region 5 having a high impurity concentration is formed in the surface area of the buffer region 4. An n-type drift region 6 is formed between the p-type body region 2 and n-type buffer region 4 in order to obtain a high breakdown voltage. The dose of impurities of the n-type drift region 6 is $2\times10^{12}$ cm$^{-2}$ to $2\times10^{13}$ cm$^{-2}$. The impurity concentration of the n-type buffer region 4 is higher than that of the n-type drift region 6, and the region 4 is provided for the purpose of relieving the concentration of electric fields and decreasing the resistance but not necessarily required. A source electrode 7 is formed on the p-type body region 2 so as to be connected with both the body region 2 and source region 3, and a drain electrode 8 is formed on the n⁺-type drain region 5. A gate electrode 10 is provided on the surface of the p-type body region 2 between the regions 3 and 6, with a gate oxide film 9 interposed therebetween. The surface of the resultant structure is protected by the insulation film 11 such as a silicon oxide film.

A plurality of trenches 12 are formed in the drift region 6 between the regions 2 and 4. A silicon oxide film 13 having a thickness of 5 to 100 nm is formed on the sides and bottom of each of the trenches 12, and a semi-insulating polycrystalline silicon (SIPOS) film 14 having a high resistance is buried therein. The trenches 12 are formed by RIE (Reactive Ion Etching), the SIPOS film 14 is deposited by LPCVD, and an undesired portion is removed by dry etching such as RIE and CDE (Chemical Dry Etching). The trenches 12 each have a width w of 0.3 $\mu$m to 1 $\mu$m, and the distance d between adjacent trenches is 0.5 $\mu$m to 5 $\mu$m. The length L of each trench is equal to that of the drift region 6 and set in accordance with the breakdown voltage of the device. If the breakdown voltage is 500 V, the length L is about 50 $\mu$m. The depth of the trenches 12 is substantially equal to that of the drift region 6. As diagrammatically shown in FIG. 2, the SIPOS film 14 is connected to the source electrode 7 at the source-side ends of the trenches 12 and it is connected to the drain electrode 8 at the drain-side ends thereof. The SIPOS film 14 can be connected to the gate electrode 10 at the source-ends. The resistance of the film 14 can be adjusted by the concentration of oxygen contained therein and the dimensions of the trenches 12. The most of the drift region 6 is divided into a plurality of long portions by the trenches 12. The section of FIG. 3, which shows not the trenches 12 but the portion obtained by dividing the drift region 6, corresponds to that of a normal high-breakdown voltage MOSFET having no trenches. If, in the normal high-breakdown voltage MOSFET, a high voltage is applied in the OFF state, a depletion layer expands in an n-type drift region and a p⁻-type layer to relieve the concentration of electric fields and thus to obtain a high breakdown voltage.

In the above high breakdown voltage MOSFET of the first embodiment, if a voltage is applied between the drain and source so as to set the drain at a high potential, the potentials corresponding to the voltage are distributed in the SIPOS film 14 in each of the trenches 12. In that part of the n-type drift region 6 which is interposed between two adjacent trenches 12, a depletion layer expands not only from a pn junction between the part and the p⁻-type layer 1 or p-type body region 2, but also from an interface between the part and each of the trenches 12. The n-type drift region 12 is depleted more easily than in the structure with no trenches. Even though the impurity concentration of the n-type drift region 6 is set higher than the optimum value in the device having no trenches, the drift region 6 will be depleted. Thus, the impurity concentration of the drift region 6 can be increased without lowering the breakdown voltage. Consequently, the resistance of the drift region can be decreased, as can be the on-resistance of the high breakdown voltage MOSFET. If the width w of each trench 12 is 1 $\mu$m, the distance d between adjacent trenches is 1 $\mu$m, and the depth thereof is about 4 $\mu$m, the impurity concentration of the n-type drift region 6 can be about four times as high as that in the device with no trenches, and the resistance of the drift region can be reduced to half. Similarly, the resistance of the drift region can be reduced to half even if the width w and distance d are each 0.5 $\mu$m and the depth is about 1 $\mu$m. The trenches 12 having such dimensions can be formed by conventional lithography or RIE. If the width w and distance d are further decreased and the depth of the trenches are further increased, the dose of impurities of the n-type drift region 6 can be increased more than $2 \times 10^{13}$ cm$^{-2}$. It is advisable that the thickness of the silicon oxide film 13 be about one sixth of the distance d between the trenches 12.

In the first embodiment, the SIPOS film 14 is buried into each of the trenches 12; however, it can be replaced with polysilicon whose impurity concentration is low.

Figure 5:
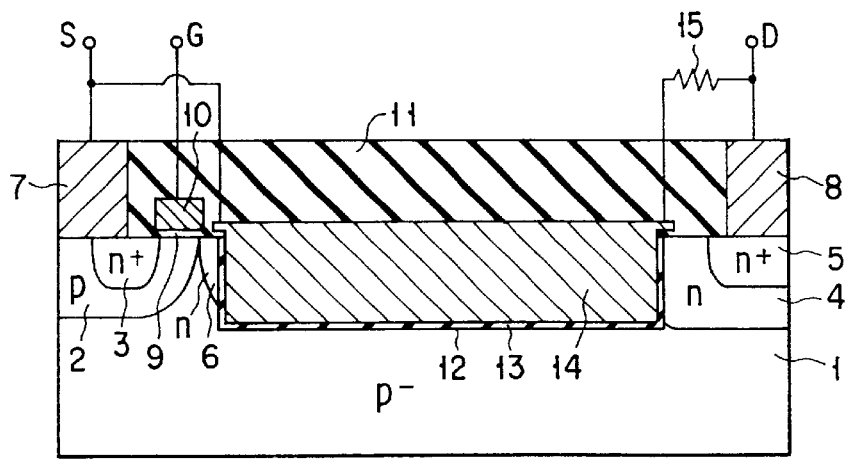
FIG. 5 is a cross-sectional view showing a high breakdown voltage MOSFET according to a second embodiment of the present invention.

A high breakdown voltage MOSFET according to a second embodiment of the present invention is illustrated in FIG. 5 corresponding to FIG. 2 showing that of the first embodiment. In the second embodiment, a resistor 15 is inserted between the drain-side end of the SIPOS film 14 and the drain electrode 8. In order to make the impurity concentration of the n-type drift region 6 as high as possible, the values of the resistor 15 can be adjusted to control the distribution of potentials caused on the SIPOS film 14. Similarly, a resistor can be inserted between the source-side end of the SIPOS film 14 and the source electrode 7 (or gate electrode 10), though not shown.

Figure 6:
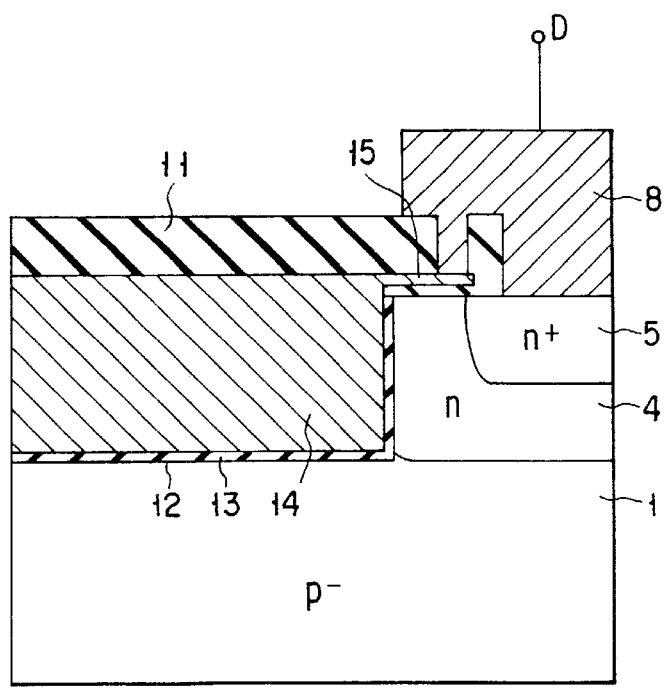
FIG. 6 is a cross-sectional view partly showing a high breakdown voltage MOSFET according to the second embodiment of the present invention.

The high breakdown voltage MOSFET of the second embodiment can actually be constituted as illustrated in FIG. 6. FIG. 6 is a cross-sectional view of the structure of the periphery of the drain. The drain-side end of the SIPOS film 14 is extended and connected to the drain electrode 8 directly. That portion of the SIPOS film 14 which extends from the drain electrode 8 to the trenches 12 (i.e., the extended portion of the film 14) serves as the resistor 15.

Figure 7:
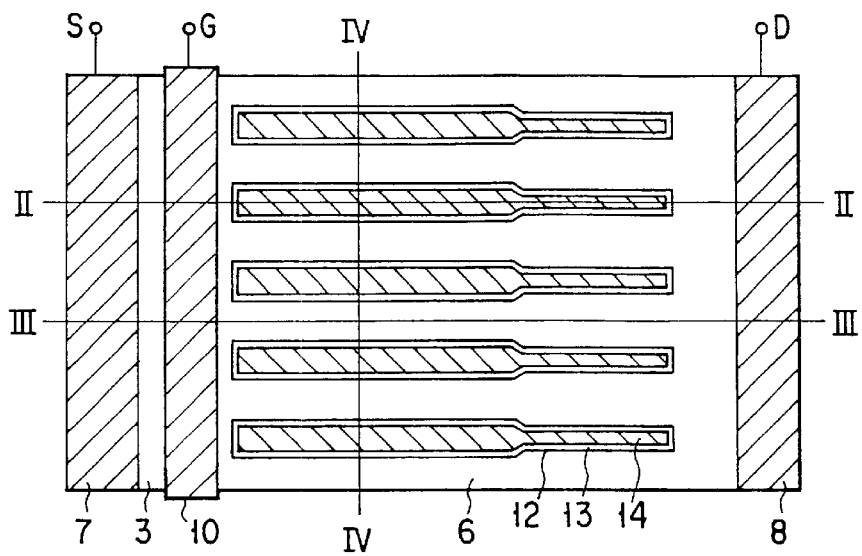
FIG. 7 is a cross-sectional view showing a high breakdown voltage MOSFET according to a third embodiment of the present invention.

FIG. 7 is a plan view showing the major part of a high breakdown voltage MOSFET according to a third embodiment of the present invention. The sections taken along lines II—II, III—III, IV—IV in FIG. 7 correspond to those of FIGS. 2, 3 and 4, respectively. In the third embodiment, the trenches 12 are decreased in width on the drain side. If the n-type drift region 6 is thickened on the drain side, the breakdown voltage can be higher than that of the first embodiment. The same breakdown voltage increases the total amount of impurity of the n-type drift region 6 and lowers the on-resistance further.

Figure 8:
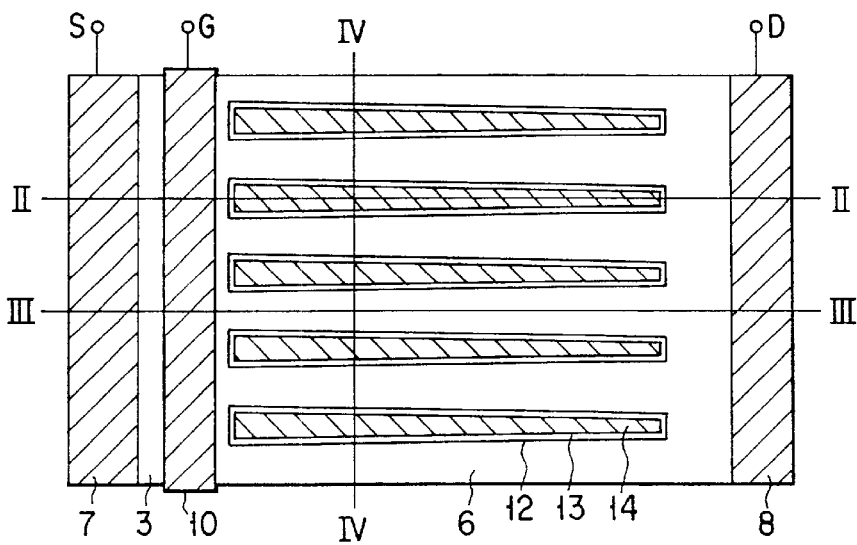
FIG. 8 is a plan view showing a high breakdown voltage MOSFET according to a fourth embodiment of the present invention.

FIG. 8 is a plan view showing the major part of a high breakdown voltage MOSFET according to a fourth embodiment of the present invention. The sections taken along lines II—II, III—III, IV—IV in FIG. 8 correspond to those of FIGS. 2, 3 and 4, respectively. In the fourth embodiment, the trenches 12 are decreased in width gradually from the source toward the drain. As in the third embodiment, the breakdown voltage can be higher than that of the first embodiment. The same breakdown voltage increases the total amount of impurity of the n-type drift region 6 and lowers the on-resistance further.

Figure 9:
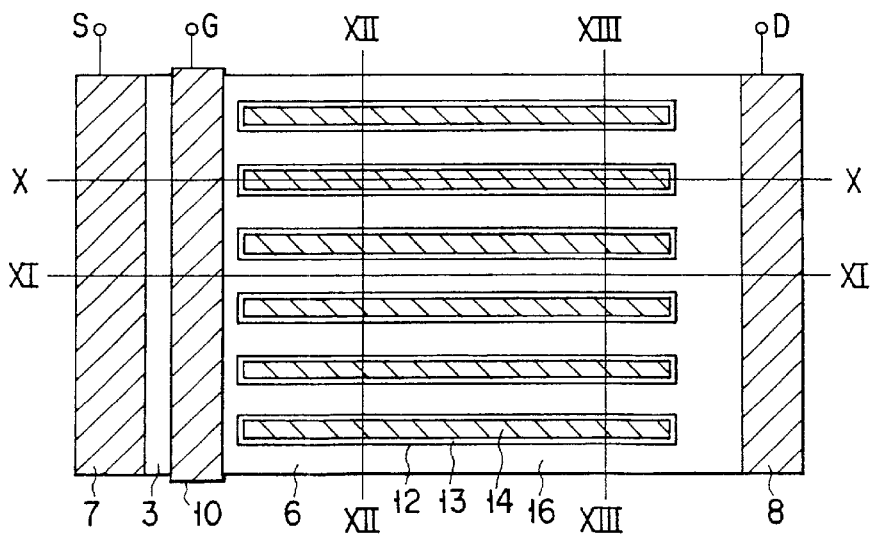
FIG. 9 is a plan view showing a high breakdown voltage MOSFET according to a fifth embodiment of the present invention.
Figure 10:
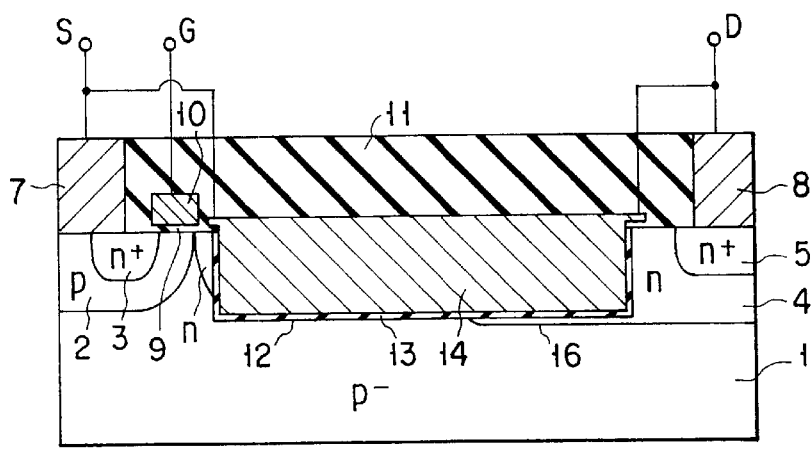
FIG. 10 is a cross-sectional view taken along line X—X of FIG. 9.
Figure 11:
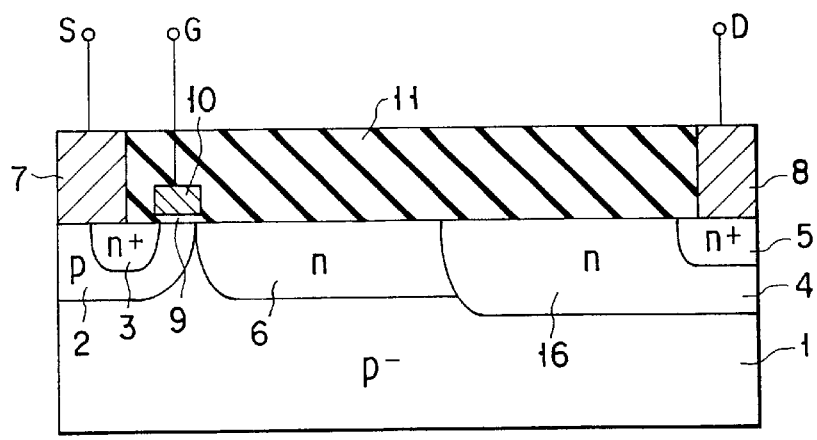
FIG. 11 is a cross-sectional view taken along line XI—XI of FIG. 9.
Figure 12:
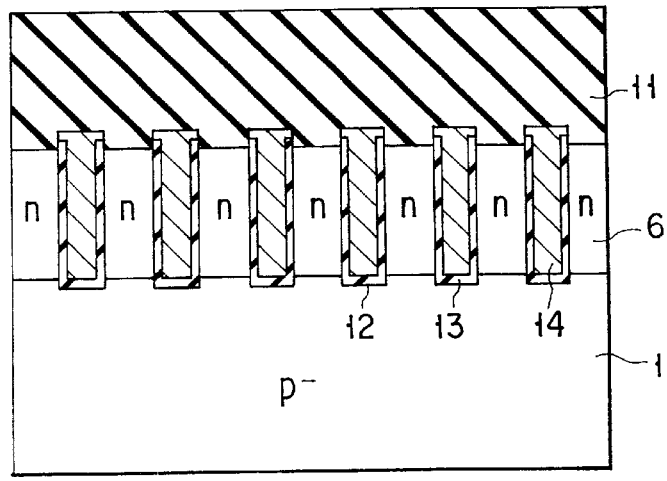
FIG. 12 is a cross-sectional view taken along line XII—XII of FIG. 9.
Figure 13:
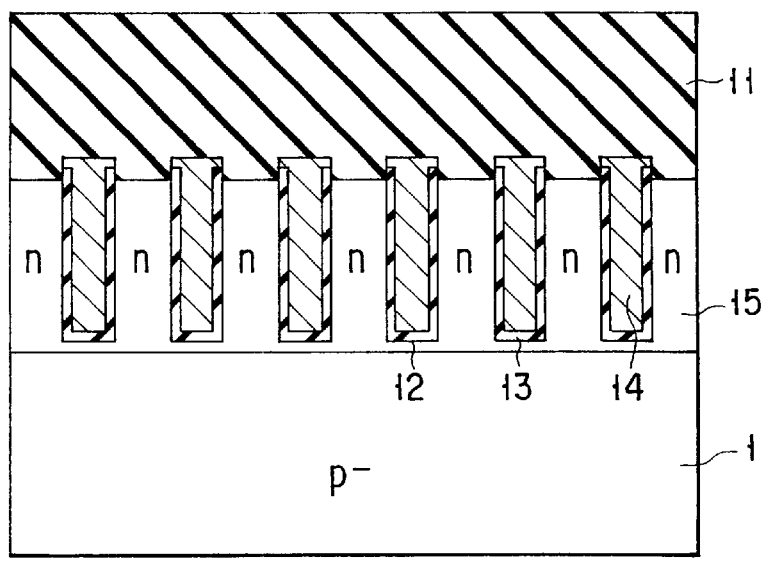
FIG. 13 is a cross-sectional view taken along line XIII—XIII of FIG. 9.

FIGS. 9 to 13 illustrate the major part of a high breakdown voltage MOSFET according to a fifth embodiment of the present invention. FIG. 9 is a plan view thereof, and FIGS. 10 to 13 are cross-sectional views taken along lines X—X, XI—XI, XII—XII and XIII—XIII of FIG. 9, respectively. In the fifth embodiment, a second n-type drift region 16 is provided in the drift region 6 near the drain. The dose of the second drift region 16 is substantially the same as that of the drift region 6, and the depth thereof is equal to or greater than that of the drift region 6. As in the third and fourth embodiments, the breakdown voltage can be made higher than that in the first embodiment by diffusing more impurities into the drain side of the n-type drift region than the source side thereof. The same breakdown voltage increases the total amount of impurity of the n-type drift region and lowers the on-resistance further.

Figure 14:
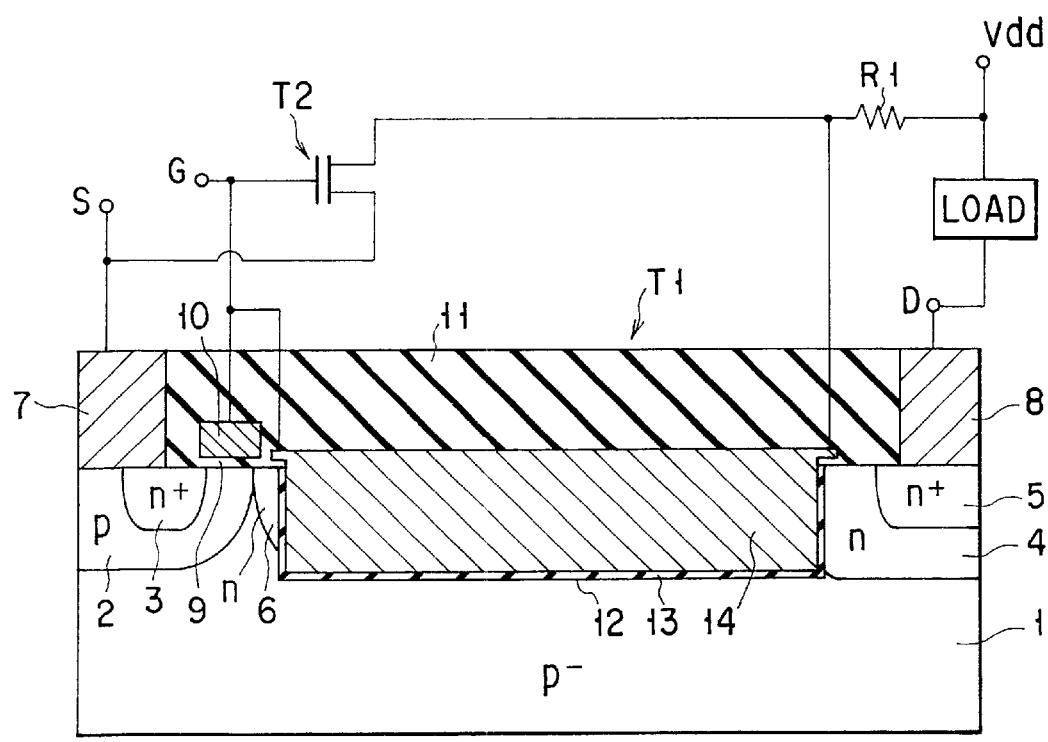
FIG. 14 is an illustration of a high breakdown voltage semiconductor device according to a sixth embodiment of the present invention.
Figure 15:
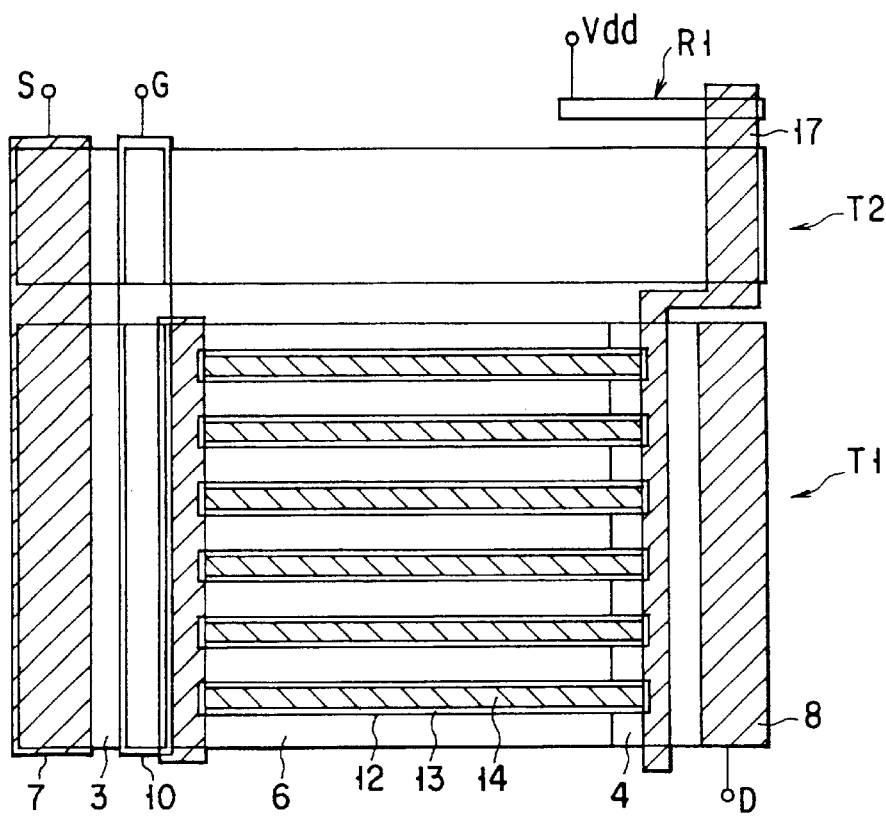
FIG. 15 is a plan view of the high breakdown voltage semiconductor device according to the sixth embodiment of the present invention.

FIGS. 14 and 15 are illustrations of a high breakdown voltage semiconductor device according to a sixth embodiment of the present invention. The device of the sixth embodiment includes the same high-breakdown voltage MOSFET T1 as that of the first embodiment, a second high-breakdown voltage MOSFET T2, and a resistor R1. However, the SIPOS film 14 and drain electrode 8 are not directly connected to each other. FIG. 14 shows that a load is connected to these constituting elements. The MOSFET T1 is illustrated by the sectional view corresponding to FIG. 2 of the first embodiment. FIG. 15 shows one example of the plane structure for accomplishing the structure shown in FIG. 14, and not any loads.

As in the first embodiment, a plurality of trenches 12 are formed in the drift region of the first high-breakdown voltage MOSFET T1 serving as the main element. The SIPOS film 14 is buried into each of the trenches 12, and one of the film 14 is connected to the gate electrode 10 of the MOSFET T1, while the other end thereof is connected to the drain electrode 17 of the second high-breakdown voltage MOSFET T2 and one end of the resistor R1. The sources of the first and second MOSFETs T1 and T2 are connected to each other, as are the gates thereof. The first and second MOSFETs T1 and T2 are designed so as to have substantially the same breakdown voltage. However, the second MOSFET T2 may have a high on-resistance. The other end of the resistor R1 is connected to a high-voltage DC power supply Vdd. A load is connected between the drain electrode 8 of the MOSFET T1 and the DC power supply Vdd.

Assuming that the operation voltage Vg of the gate is 5 V and the DC power supply voltage Vdd is 200 V, the first MOSFET T1 usually necessitates a breakdown voltage of about 400 V and the drift region requires a length of about 40 μm. If the resistance of the resistor R1 is r1, the resistance of parallel connection of all the SIPOS films 14 is r2, and the on-resistance of the second MOSFET T2 is r3, r1:r2:r3 is, for example, 39:3900:1. It is desirable that the absolute value of these resistances be larger.

When the gate is turned on by applying a 5V-voltage thereto, the drain voltage v of the MOSFET T2 is set to 5V and so is the potential of all the SIPOS films 14, since the ratio of r1 to r3 is 39:1(=(Vdd–Vg):Vg). Thus, electrons are induced on the sides of the trenches 12 to form a storage layer and decrease the drift resistance further, with the result that the on-resistance of the entire MOSFET T1 is lowered. The ratio of r1 to r3 need not be 39:1 strictly and if it is not too small, the same advantage can be obtained. If the ratio of r1 to r3 is set larger than that of (Vdd–Vg) to Vg, the advantage of causing the storage form to be formed becomes greater. However, the drain voltage v has to be used within such a range that it exceeds a voltage of the trenches 12 or a voltage corresponding to the gate breakdown voltage.

When the gate is turned off, the same condition is obtained as in the second embodiment and the potentials are distributed on the SIPOS film in accordance with the ratio of r1 to r2. The potential at the drain-side end of the SIPOS film 14 is close to that of the drain, and the potential at the gate-side end thereof is equal to that of the gate. A potential gradient occurs on the entire SIPOS film 14 such that the potential increases gradually from the gate toward the drain. As compared with a device having no trenches, not only the breakdown voltage of the MOSFET T1 can be maintained, but also it can be increased further. Like in the first embodiment, a depletion layer expands from the interface between the n-type drift region 6, which is interposed between adjacent two trenches 12, and each side of the trench 12, so that the impurity concentration of the drift region 6 can be increased.

Consequently, according to the sixth embodiment, the resistance of the drift region can be lowered by the two advantages: the impurity concentration of the drift region 6 can be set high, and electrons are induced on the sides of the trench 12 to cause a storage layer.

In the sixth embodiment, the high breakdown voltage MOSFET of the third to fifth embodiments can be used for the MOSFET T1.

Figure 16:
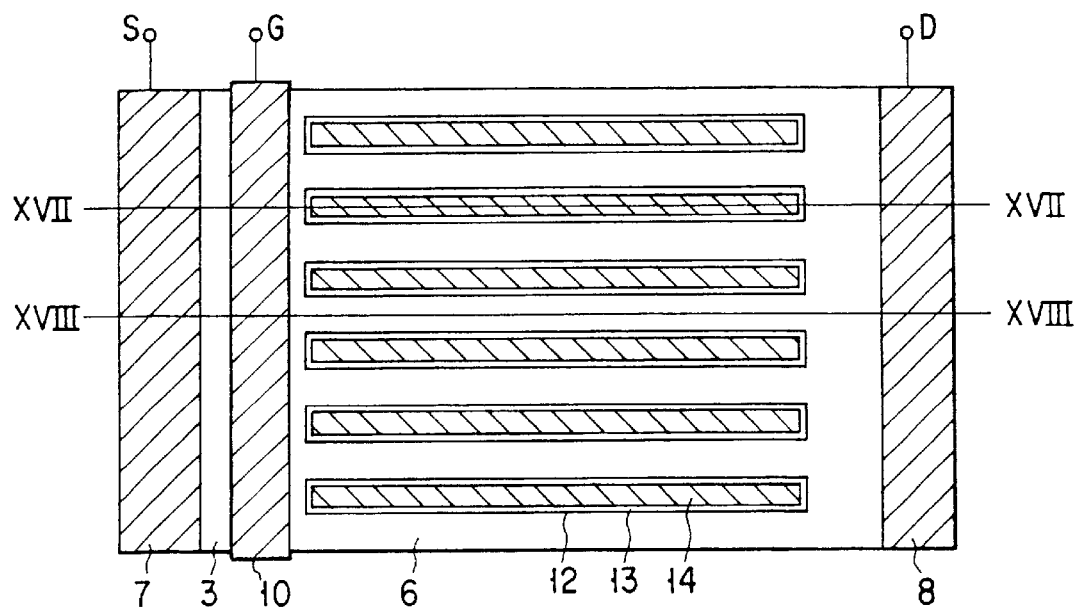
FIG. 16 is a plan view showing a high breakdown voltage MOSFET according to a seventh embodiment of the present invention.
Figure 17:
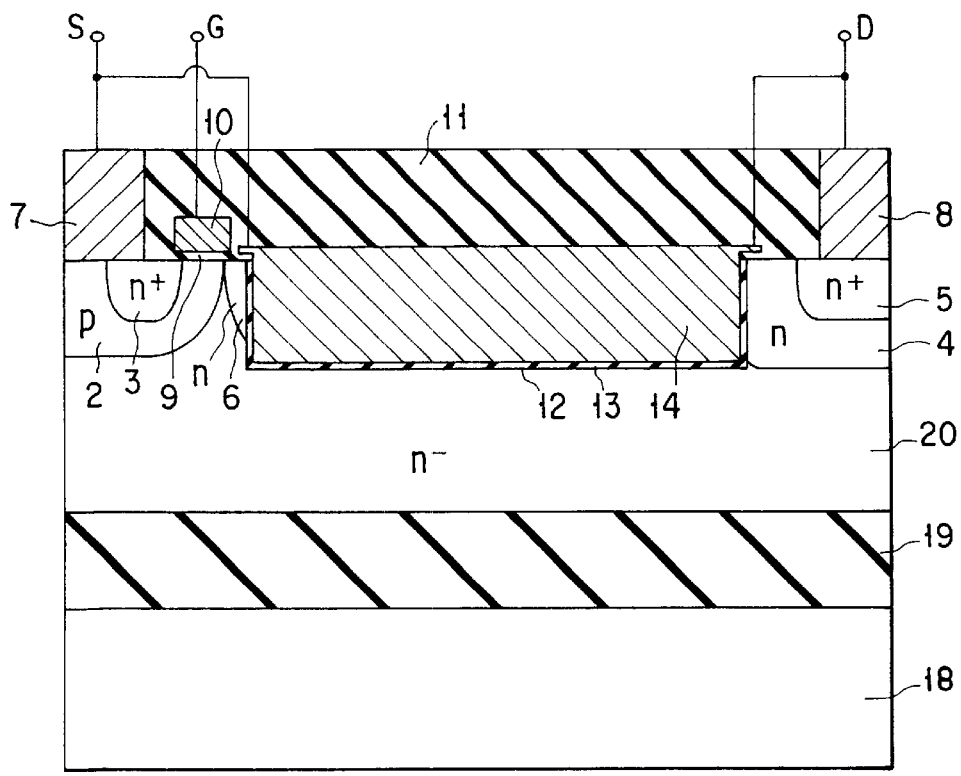
FIG. 17 is a cross-sectional view taken along line XVII—XVII of FIG. 16.
Figure 18:
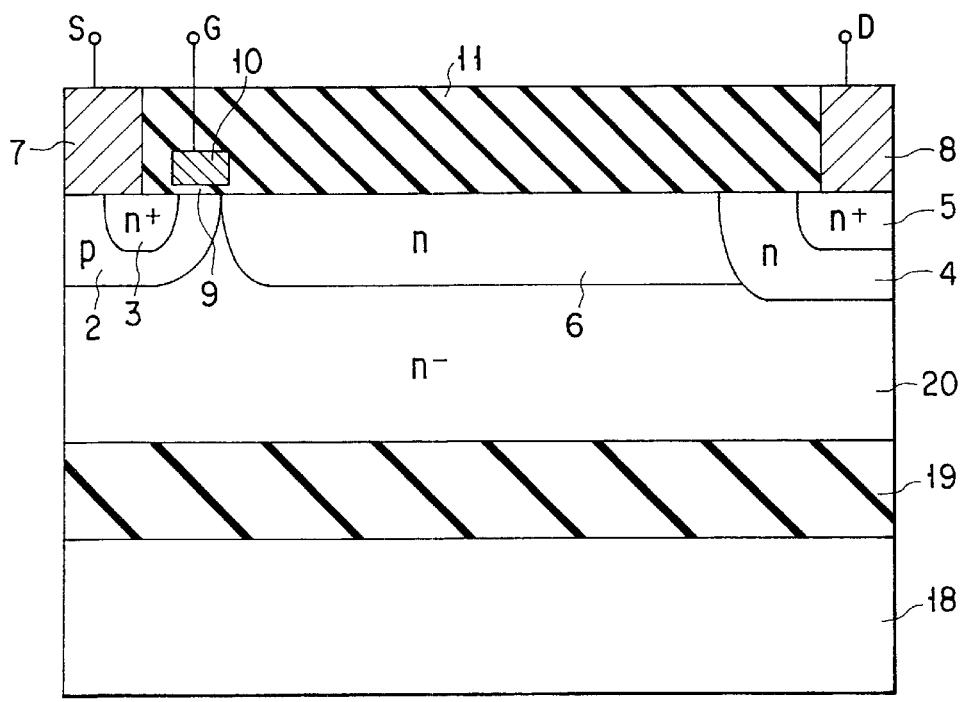
FIG. 18 is a cross-sectional view taken along line XVIII—XVIII of FIG. 16.

FIGS. 16 to 18 show the major part of a high breakdown voltage MOSFET according to a seventh embodiment of the present invention. FIG. 16 is a plan view thereof, and FIGS. 17 and 18 are cross-sectional views taken along lines XVII—XVII and XVIII—XVIII of FIG. 16, respectively. In the seventh embodiment, the device of the first embodiment is modified and formed on an SOI substrate. A buried oxide film 19 is formed on a silicon substrate 18, and a high-resistance n⁻-type layer 20 is formed thereon. The same high breakdown voltage MOSFET as that of the first embodiment is formed on the SOI substrate. As in the first embodiment, the impurity concentration of the n-type drift region 6 can be heightened without lowering the breakdown voltage; therefore, the drift region can be decreased in resistance. The n⁻-type layer 20 can be replaced with a high-resistance p-type layer.

Figure 19:
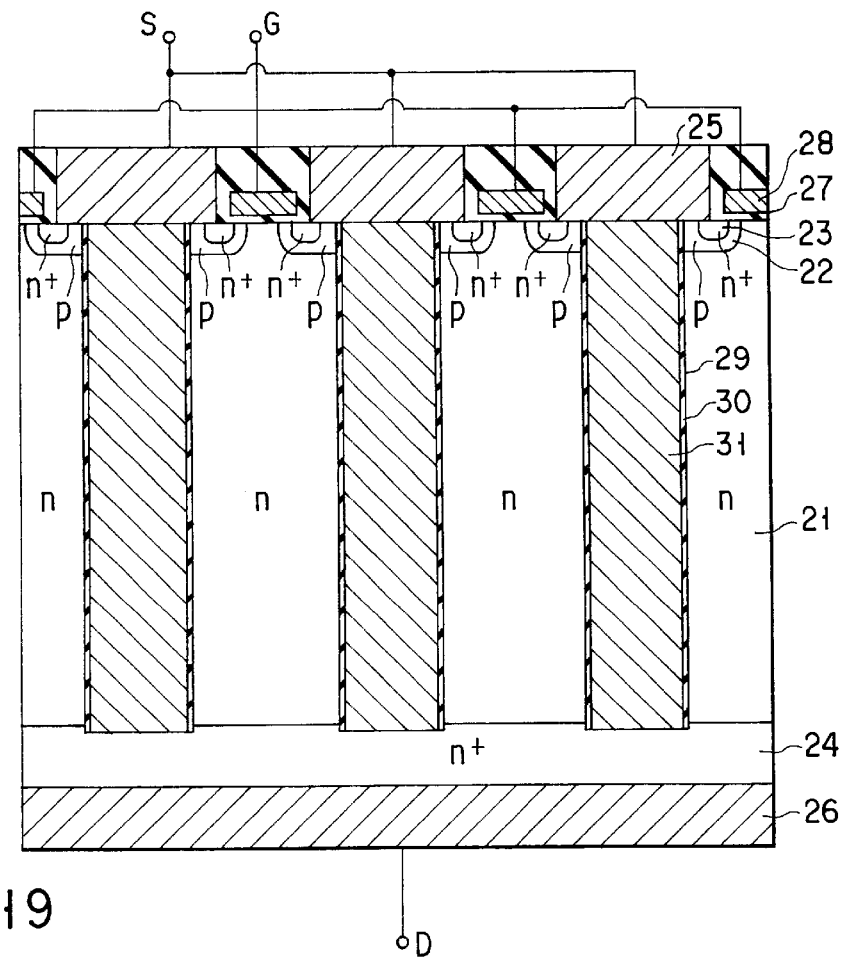
FIG. 19 is a cross-sectional view showing a high breakdown voltage MOSFET according to an eighth embodiment of the present invention.

FIG. 19 is a cross-sectional view showing the major part of a vertical high-breakdown voltage MOSFET to which the present invention is applied as an eighth embodiment. An n-type drift layer 21 is formed in a monocrystalline silicon active layer, and a p-type body region 22 is formed selectively in the surface region of the drift layer 21. A high impurity concentration n⁺-type source region 23 is formed on the surface region of the region 22. A high impurity concentration n⁺-type drain region 24 is formed on the opposite surface of the drift layer 21. A source electrode 25 is formed on the p-type body region 22 so as to connect with both the regions 22 and 23, and a drain electrode 26 is formed in the n⁺-type drain region 24. A gate electrode 28 is provided on the surface of the p-type body region 22, which is interposed between the n⁺-type source region 23 and n-type drift layer 21, with a gate oxide film 27 therebetween.

A plurality of trenches 29 are formed in the n-type drift layer 21 to such a depth as to reach the n⁺-type drain region 24. A silicon oxide film 30 having a thickness of about 5 nm to 100 nm is formed on the side wall of each of the trenches 29, and a high-resistance SIPOS film 31 is buried therein. The trenches 29 need not necessarily reach the n⁺-type drain region. The SIPOS film 31 is connected to the n⁺-type drain region 24 at the bottom and connected to the source electrode 25 on the top. In the eighth embodiment, too, a depletion layer expands from the interface between the n-type drift layer 21 and each of the trenches 29 in the drift layer 21 when a high voltage is applied, so that the impurity concentration of the drift layer 21 can be increased without lowering the breakdown voltage, thus decreasing the resistance of the drift layer.

Figure 20:
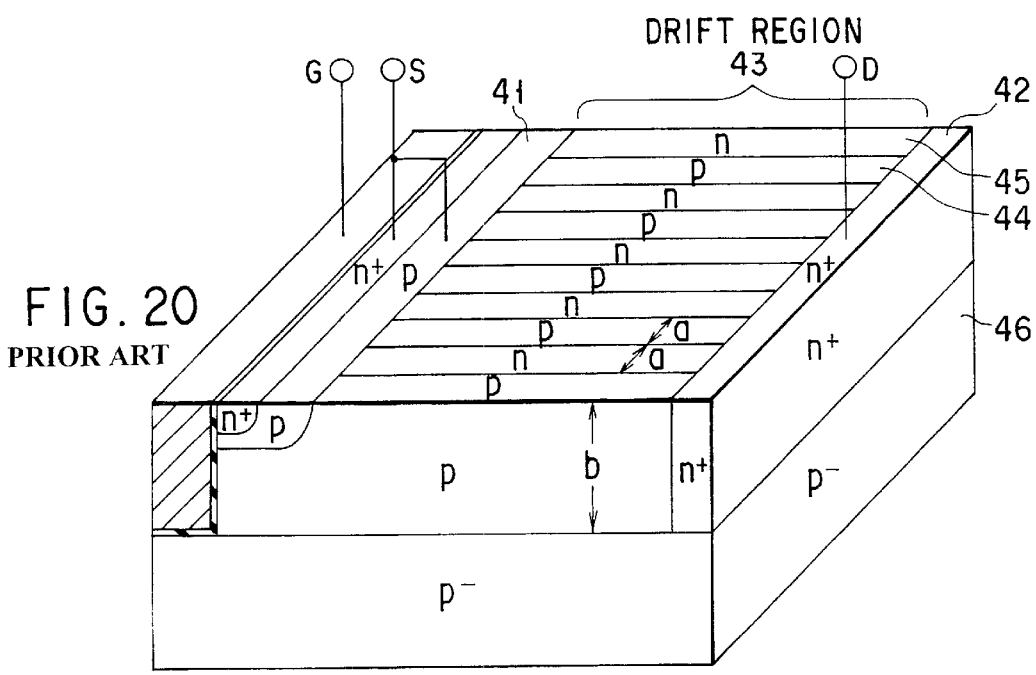
FIG. 20 is a cross-sectional view of a prior art superjunction high breakdown voltage MOSFET.

An example where the present invention is applied to an n-channel high breakdown voltage MOSFET, has been described. It is needless to say that the present invention can be applied to a p-channel high breakdown voltage MOSFET. It can also be applied to another high breakdown voltage semiconductor device such as IGBT. The device can be constituted to have a trench gate like that shown in FIG. 20.

As a film to be buried in the trenches, a low impurity concentration polysilicon film can be used in place of the SIPOS film, as can be another high-resistance film.

According to the high breakdown voltage semiconductor device described above, the impurity concentration of the drift region can be heightened and the on-resistance can be lowered by decreasing the drift resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high breakdown voltage semiconductor device formed on a high resistance semiconductor layer, comprising:

a plurality of trenches formed like a stripe in a drift region in substantially parallel with a current flowing direction;

an insulation film formed on a side and a bottom of each of the trenches; and a high resistance film buried into each of the trenches with the insulation film interposed therebetween, wherein the high resistance film is connected to one of source and gate electrodes directly or through a resistor near a source-end portion of each of the trenches, and the high resistance film is connected to a drain electrode directly or through a resistor near a drain-end portion of each of the trenches.

2. A high breakdown voltage semiconductor device formed on a high resistance semiconductor layer of a first conductivity type, comprising:

a drift region of a second conductivity type selectively formed on a surface of the high resistance semiconductor layer;

a plurality of trenches formed like a stripe in the drift region in substantially parallel with a current flowing direction;

an insulation film formed on a side and a bottom of each of the trenches; and a high resistance film buried into each of the trenches with the insulation film interposed therebetween, wherein the high resistance film is connected to one of source and gate electrodes directly or through a resistor near a source-end portion of each of the trenches, and the high resistance film is connected to a drain electrode directly or through a resistor near a drain-end portion thereof.

3. A high breakdown voltage semiconductor device including a first high breakdown voltage MOSFET, a second high breakdown voltage MOSFET, a resistor, comprising:

a plurality of trenches formed like a stripe in a drift region of the first high breakdown voltage MOSFET, in substantially parallel with a current flowing direction;

an insulation film formed on a side and a bottom of each of the trenches; and a high resistance film buried into each of the trenches with the insulation film interposed therebetween, wherein the first high breakdown voltage MOSFET and the second high breakdown voltage MOSFET have a common source electrode and a common gate electrode, and one end of the high resistance film is connected to the common gate electrode, while another end thereof is connected to a drain electrode of the second high breakdown voltage MOSFET and one end of the resistor.

4. The high breakdown voltage semiconductor device according to claim 3, the first high breakdown voltage MOSFET and the second high breakdown voltage MOSFET are formed in a common semiconductor layer.

5. A high breakdown voltage semiconductor device formed on a high resistance semiconductor layer, comprising:

a plurality of trenches formed like a stripe in a drift region in substantially parallel with a current flowing direction;

an insulation film formed on a side of each of the trenches; and a high resistance film buried into each of the trenches, wherein the high resistance film is connected to one of source and gate electrodes directly or through a resistor near a source-end portion of each of the trenches, and the high resistance film is connected to a drain region near a drain-end portion of each of the trenches.

6. The high breakdown voltage semiconductor device according to claim 1, wherein the high resistance film is formed on one of a semi-insulating polycrystalline silicon and polysilicon.

7. The high breakdown voltage semiconductor device according to claim 2, wherein the high resistance film is formed on one of a semi-insulating polycrystalline silicon and polysilicon.

8. The high breakdown voltage semiconductor device according to claim 3, wherein the high resistance film is formed on one of a semi-insulating polycrystalline silicon and polysilicon.

9. The high breakdown voltage semiconductor device according to claim 4, wherein the high resistance film is formed on one of a semi-insulating polycrystalline silicon and polysilicon.

10. The high breakdown voltage semiconductor device according to claim 5, wherein the high resistance film is formed on one of a semi-insulating polycrystalline silicon and polysilicon.

* * * * *